United States Patent [19]

Kaganowicz et al.

[11] Patent Number: 4,804,640
[45] Date of Patent: Feb. 14, 1989

[54] METHOD OF FORMING SILICON AND ALUMINUM CONTAINING DIELECTRIC FILM AND SEMICONDUCTOR DEVICE INCLUDING SAID FILM

[75] Inventors: Grzegorz Kaganowicz, Belle Mead, N.J.; John W. Robinson, Levittown, Pa.; Alfred C. Ipri, Princeton, N.J.

[73] Assignee: General Electric Company, Fairfield, Conn.

[21] Appl. No.: 104,451

[22] Filed: Oct. 5, 1987

Related U.S. Application Data

[62] Division of Ser. No. 769,975, Aug. 27, 1985.

[51] Int. Cl.$^4$ .......................................... H01L 21/473
[52] U.S. Cl. ...................... 437/236; 437/42; 437/195; 204/192.22; 204/192.23; 357/54
[58] Field of Search .......... 437/236, 237, 239; 204/192.22, 192.23; 357/54

[56] References Cited

U.S. PATENT DOCUMENTS

| | | | |
|---|---|---|---|
| 3,287,243 | 11/1966 | Ligenza | 204/192.22 |
| 4,086,614 | 4/1978 | Scheidel | 357/54 |
| 4,268,711 | 5/1981 | Gurev | 136/256 |
| 4,409,260 | 10/1983 | Pastor et al. | 437/239 |
| 4,510,172 | 4/1985 | Ray | 427/38 |
| 4,566,173 | 1/1986 | Gössler et al. | 437/236 |

FOREIGN PATENT DOCUMENTS 1204544  9/1970  United Kingdom .

OTHER PUBLICATIONS

ABOAF, IBM Tech. Disc. Bull., vol. 9, No. 4 (Sep. 1966).
Burkhardt, IBM Tech. Disc. Bull., vol. 10, No. 2 (Jul. 1967), p. 160.

*Primary Examiner*—Olik Chaudhuri
*Attorney, Agent, or Firm*—E. M. Whitacre; D. H. Irlbeck; L. L. Hallacher

[57] ABSTRACT

A process of forming a three region dielectric film on silicon and a semiconductor device employing such a film are disclosed. Silicon is oxidized in an oxygen-containing ambient. The oxidation step forms a first region of silicon oxide. Once oxidation has begun, reactive sputtering of aluminum in an oxygen plasma is initiated. This forms a second region of said dielectric film which comprises a mixture of silicon and aluminum oxides. A third region comprising substantially aluminum oxide is formed by the continuing reactive sputtering step.

A semiconductor device comprising said three region dielectric film interposed between an electrode and a semiconductor body has little or no shift in threshold voltage providing good stability and can be fabricated in substantially less time and/or at lower temperatures than prior art methods.

6 Claims, 2 Drawing Sheets

4,804,640

METHOD OF FORMING SILICON AND ALUMINUM CONTAINING DIELECTRIC FILM AND SEMICONDUCTOR DEVICE INCLUDING SAID FILM

This is a division of application Ser. No. 769,975, filed Aug. 27, 1985.

The present invention relates to a method of forming a dielectric film on a silicon body and a semiconductor device fabricated by such a method.

BACKGROUND OF THE INVENTION

Dielectric materials such as silicon oxide ($SiO_x$ wherein $1 < x < 2$) are widely used in the manufacture of semiconductor devices. These materials find use not only as final passivation coatings for completed devices but also as intermediate insulating layers for multi-layer devices. Thermally grown oxides, such as silicon oxide, are typically employed as dielectric films, e.g. a gate dielectric, in semiconductor devices such an EAROM (electrically alterable read only memory), a MOSFET (metal-oxide-semiconductor field effect transistor), capacitors and the like. Thermal oxidation methods, by which the best silicon oxide films are produced, are usually carried out by placing silicon in an oxygen ambient at temperatures between 800° and 1200° C. In many situations these temperatures are too high for the substrate. For instance, in applications where the dielectric film to be formed is part of a semiconductor device being fabricated over a glass substrate, lower process temperatures are required. Specifically, in the area of liquid crystal displays, thin film transistors are fabricated over glass substrates having a softening point of about 650° C. Therefore, to thermally grow an oxide onto silicon over glass, the temperature of the substrate in the oxygen ambient is kept at about 600° C. which requires about 120 hours to grow 60-70 nanometers (nm) of silicon oxide.

Silicon oxide ($SiO_x$), aluminum oxide, and silicon nitride can be deposited at temperatures below 600° C. by glow discharge and other chemical vapor deposition (CVD) techniques, in a fraction of the time required for thermal growth, e.g. a few hours or less. However, the dielectric quality of the deposited film is poor compared to the thermally grown material. Specifically, the transistor turn on voltage for deposited silicon dioxide films is typically unstable. It is believed that charge traps within the film and/or at the silicon-dielectric interface cause the film to accumulate a charge upon the initial applications of voltage. Subsequent applications of voltage are characterized by a shift in the tun on, or threshold, voltage of 5 to 10 volts or more, compared to little or no shift in the threshold voltage for thermally grown oxide.

Further, in applications requiring a dielectric over hydrogenated amorphous silicon, it is desirable to keep processing temperatures below about 400° C. This is because the semiconductive properties of amorphous silicon change at temperatures above 400° C., probably due to a loss of hydrogen from the film above that point.

It would be desirable therefore to have a method of producing a dielectric film at a temperature below 600° C. and preferably below 400° C. wherein the rate of film formation is substantially increased over thermally grown films in that temperature range without a substantial sacrifice in dielectric stability.

SUMMARY OF THE INVENTION

A process of forming a three region dielectric film on silicon and a semiconductor device employing such a film are disclosed. Silicon is oxidized in an oxygen-containing ambient. The oxidation step forms a first region of silicon oxide. Once oxidation has begun, reactive sputtering of aluminum in an oxygen plasma is initiated. This forms a second region of said dielectric film which comprises a mixture of silicon and aluminum oxides. A third region comprising substantially aluminum oxide is formed by the continuing reactive sputtering step.

A semiconductor device comprising said three region dielectric film interposed between an electrode and a semiconductor body has little or no shift in threshold voltage providing good stability, and can be fabricated in substantially less time and/or at lower temperatures than prior art methods.

DETAILED DESCRIPTION OF THE PREFERRED EMBODIMENTS

The present method forms a three region dielectric film over a film or substrate of silicon (amorphous, polycrystalline, single crystal) by combining oxidation and reactive sputtering techniques. A first region comprising silicon oxide ($SiO_x$ wherein $1 < x < 2$) is formed by either plasma or thermal oxidation of the silicon. The plasma oxidation process can be carried out at temperatures between 25° C. and 300° C. whereas the thermal process can be used where temperatures of 600° C. and above can be tolerated. A second region comprising a mixture of silicon and aluminum oxides is formed by the reactive sputtering of aluminum in an oxygen plasma. Continuation of the reactive sputtering ultimately provides the third region comprising substantially aluminum oxide.

Figure 1:
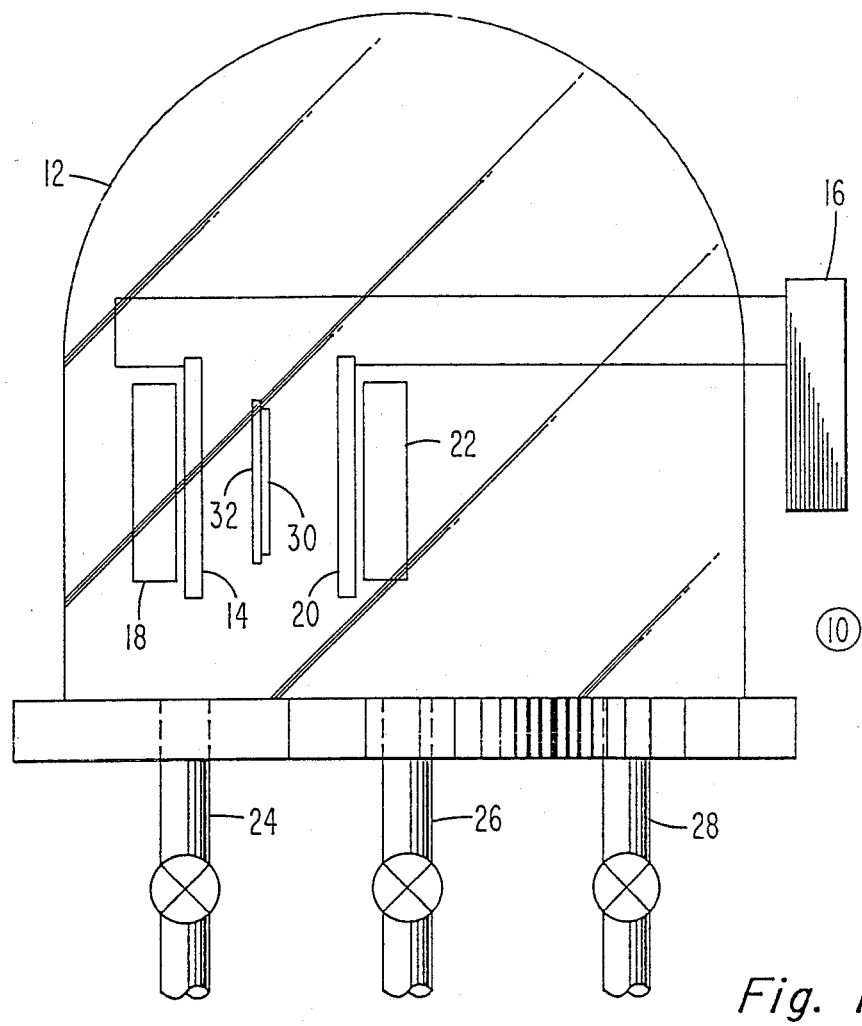
FIG. 1 is a cross-sectional view of an apparatus suitable for forming the dielectric film for the device of the present invention.

An apparatus suitable for carrying out the present process is illustrated in FIG. 1. The apparatus 10 includes a vacuum chamber 12 which can be a glass bell jar. In the vacuum chamber 12 is an electrode 14 which can be a screen, coil or plate of a material that is a good electrical conductor, such as aluminum. The electrode 14 is connected to a power supply 16, which may be DC, AC or RF to produce a voltage potential. Behind the electrode 14 is a magnet 18 which is electrically insulated from the electrode 14, which helps concentrate the plasma in the electrode area. An aluminum target 20 is also present in the event that the electrode 14 is other than aluminum. A magnet 22 is behind the target 20. An outlet 24 from the vacuum chamber 12 allows for evacuation of the system and is connected to a pumping station, not shown. A first inlet 26 and a second inlet 28 are connected to gas bleed systems not shown, for adding the appropriate gas or gases. The apparatus also includes a heat source (not shown) to heat the ambient to a desired temperature.

If the first region is to be thermally grown, the vacuum chamber 12 is evacuated and a source of oxygen such as $CO_2$, $N_2O$, $O_2$, $H_2O$ is introduced through the first inlet 26. The temperature in the chamber 12 is then elevated to about 600° C. and a desired thickness of $SiO_2$ is grown onto the silicon surface.

Alternatively, the first region can be grown at a lower temperature by plasma oxidation as described by Kaganowicz et al. in a copending application Ser. No. 687,366 filed Dec. 28, 1984. In this process the substrate 30, being of or having thereover, silicon (amorphous, polycrystalline or single crystal), is placed in front of the electrode 14. The substrate 30 overlies a mounting plate 32 and is typically placed about 1 inch from the electrode 14. The mounting plate 32 should be of a material that can act as a heat sink during the plasma oxidation process to control the temperature of the substrate 30. Such a heat sink arrangement is described in U.S. Pat. No. 4,361,595 to Kaganowicz et al., incorporated herein by reference. The consideration is that the plasma may tend to heat the substrate 30 well above 300° C. and therefore the substrate temperature should be maintained below about 300° C. Other conventional means of maintaining the temperature of the substrate 30 can likewise be utilized.

The vacuum chamber 12 is then evacuated through outlet 24 to a pressure of about 0.2 to $1.0 \times 10^{-6}$ Torr. An oxygen containing gaseous precursor is introduced into the chamber 12 through the inlet 26 to a pressure of about 50 Millitorr. Appropriate oxygen-containing precursors include oxygen, carbon dioxide and nitrous oxide and the like. In order to initiate the oxygen plasma, about 300 to 600 Watts of 13.56 MHz RF power is applied to the electrode 14 to provide an effective power density of between about 1 and 15 Watts/cm$^2$ and preferably about 5 to 7 Watts/cm$^2$.

The formation of the second region of the dielectric film of the present invention involves the utilization of an oxygen-containing plasma, as well. Therefore, if the first region was grown thermally, the vacuum chamber is evacuated and allowed to cool and the plasma is initiated as described above. If the first region is grown by the plasma oxidation technique, the plasma is merely maintained. The formation of the second region is by the reactive sputtering of the aluminum from either the electrode 14 or the target 20. That is, the oxygen plasma oxidizes the aluminum, then sputters the aluminum oxide off of the electrode 14. It is believed that at the same time the plasma causes some of the grown silicon oxide from the first region to sputter and redeposit in with the aluminum oxide being deposited from the reactive sputtering process. In this way the second region comprises a mixture of silicon and aluminum oxides. The concentration of silicon oxide decreases with increasing distance from the first region and conversely, the concentration of aluminum oxide increases with increasing distance from the first region.

Once the dielectric film has accumulated to a thickness wherein no more of the silicon oxide of the first region can be sputtered and codeposited back into the film with the aluminum oxide, the continued sputtering of the electrode 14 or target 20 by the oxygen plasma forms the third region comprising substantially aluminum oxide. This reactive sputtering can be maintained to provide a desired final film thickness.

It should be noted that when the first region is plasma grown, the plasma oxidation down into the silicon continues while the second region is being formed until the thickness of the accumulating dielectric prevents further diffusion of oxygen therethrough. If the first region is thermally grown, some further oxidation is possible during the formation of the second region; however, this is less probable where the thermally grown first region is greater than 10 nanometers in thickness.

The first region generally has a thickness of between about 5 and 20 nanometers, if plasma grown, and can have a greater thickness if thermally grown, such as about 100 nanometers.

The second region has been generally found to have a thickness between about 2 and 30 nanometers.

The third region comprising $Al_2O_3$ can be any convenient thickness but is generally kept between about 10 and 100 nanometers.

The overall thickness of the three region film can be any desired thickness according to the application involved, for instance about 100 nanometers has been found suitable for thin film transistors.

Figure 2:
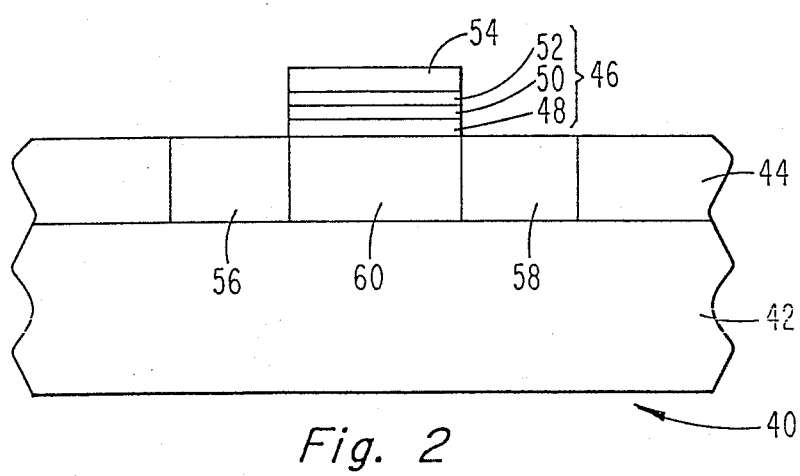
FIG. 2 is a cross-sectional view of a semiconductor device of the present invention.

FIG. 2 illustrates one embodiment of the present invention; that being a metal-oxide-semiconductor field effect transistor (MOSFET) 40. It should be noted that any semiconductor device requiring a high quality thin film dielectric would benefit by the present invention.

The transistor device 40 is fabricated by means known in the art. Over a glass substrate 42 is deposited a silicon layer 44. Then a dielectric film 46 of the present invention comprising a first region 48, a second region 50 overlying said first region 48, and a thick region 52 overlying said second region 50, is deposited over said silicon layer 44 by the methods outlined in detail above. An electrode 54 which serves as a gate in this device and which is a conductor, e.g. metal, silicides, polysilicon, is deposited over the dielectric 46 using standard photolithography techniques. Using self-aligned ion implant techniques, the silicon layer 44 can be provided with source 56 and drain 58 regions of one conductivity type and a channel region 60 of the opposite conductivity type.

While dielectric films produced by standard low temperature (<500° C.) techniques, such as glow discharge and CVD, generally produce unstable MOSFETs with threshold voltage shifts of 5 to 10 volts and more, devices produced by the present method show improved stability. Also, the rate of film formation is substantially enhanced compared to thermal oxidation techniques.

Figure 3:
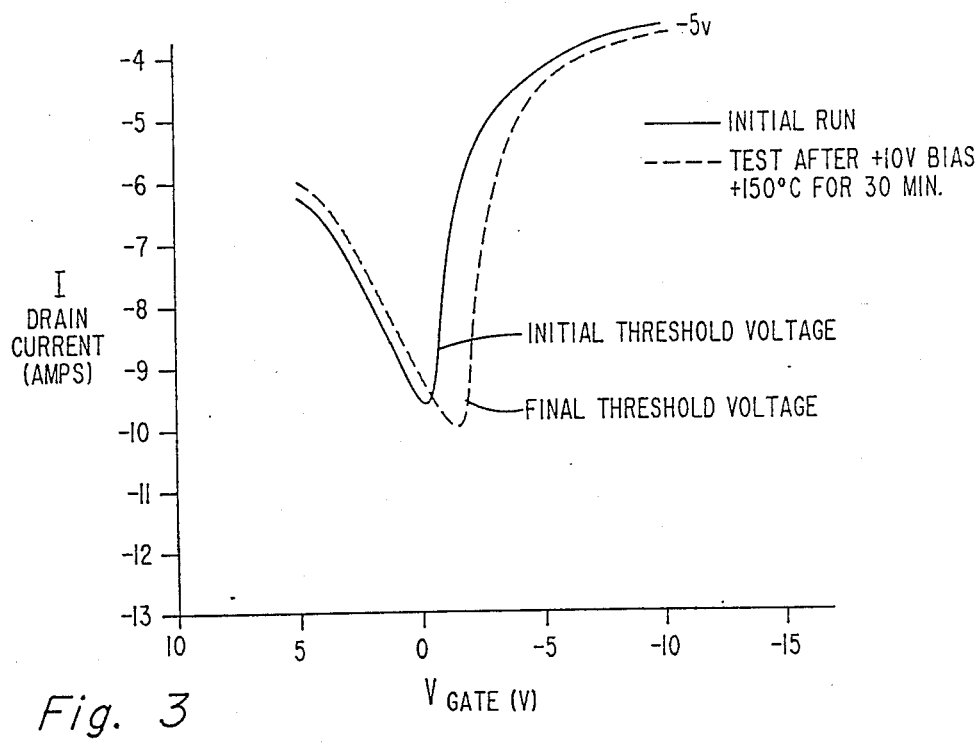
FIG. 3 illustrates the shift in threshold voltage for a device with a dielectric film having a plasma-grown first region.
Figure 4:
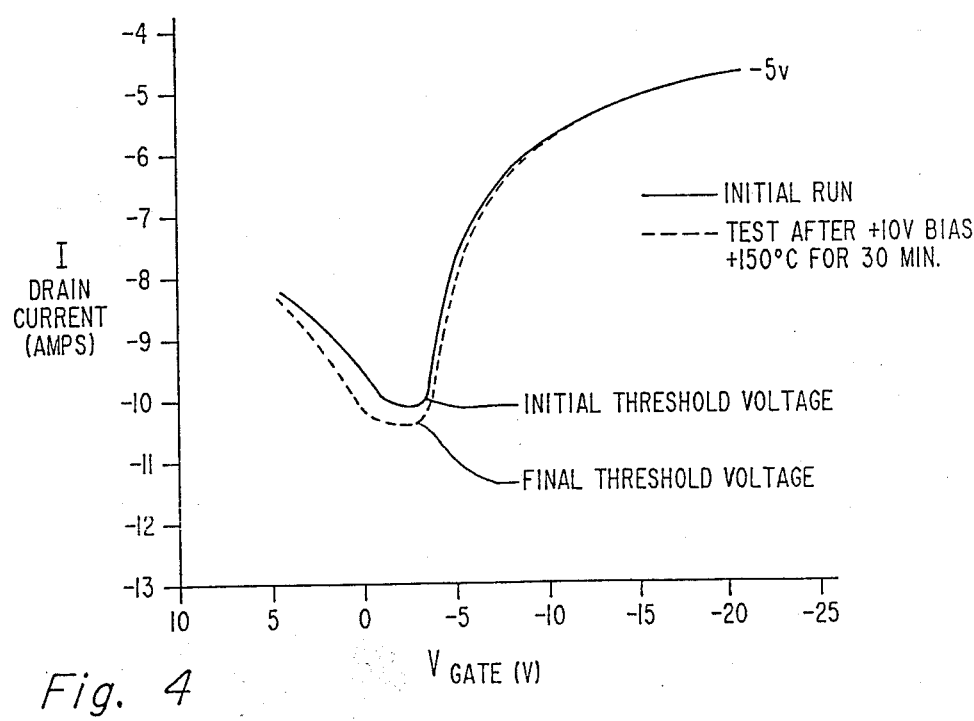
FIG. 4 illustrates the shift in threshold voltage for a device with a dielectric film having a thermally grown first region.

FIGS. 3 and 4 illustrate the stability of semiconductor devices fabricated according to the present invention. In each FIGURE, the drain current I in the transistor of FIG. 2, is plotted as a function of the gate voltage applied to the gate electrode 54 of FIG. 2. The solid line represents the current for the initial application of −5 volts to the source 56 with the drain 58 at 0 volts. The dotted line represents the current for a subsequent application of −5 volts to the source 56 after a +10 volt bias was applied to the gate electrode 54 for 30 minutes at 150° C.

Specifically, FIG. 3 illustrates the improved stability for a three region dielectric film in a MOSFET wherein the first region was plasma grown providing that the entire dielectric was formed at about 130° C. While FIG. 3 shows about a 2 volt shift for the threshold voltage in such a device following a +10 volt bias, 150°

C., 30 minute test, this is a substantial improvement in stability over the prior art techniques.

FIG. 4 shows the results of another MOSFET produced in accordance with the present invention. In this case the first region comprised about 6 nanometers of $SiO_2$ which was thermally grown at about 600° C. in about 8 hours. The second and third regions were deposited at about 130° C. in about 0.5 hours providing a total film thickness of about 7.5 nanometers in 8.5 hours. The shift in threshold voltage is negligible after the +10 volt bias after 30 minutes at 150° C. This stability is comparable to that of a thermally grown layer which would take about 120 hours to grow at 600° C.

We claim:

1. A process of forming a dielectric film on a silicon body comprising:
    (a) oxidizing the surface of the silicon body in an oxygen-containing plasma to form a first region of said film comprising silicon oxide;
    (b) sputtering aluminum in said plasma to form a second region comprising a mixture of silicon and aluminum oxides over said first region; and,
    (c) forming a third region of substantially aluminum oxide over said second region by reactive sputtering of aluminum in said plasma.

2. The process of claim 1 wherein the temperature of the ambient is maintained below about 300° C.

3. The process of claim 1 wherein step (a) is preceded by the formation of a thickness of silicon dioxide on the silicon by thermal oxidation.

4. The process of claim 1 wherein the plasma has an effective power density of between about 1 and 15 Watts/cm$^2$.

5. The process of claim 1 wherein step (a) is carried out by thermal oxidation.

6. The process of claim 5 wherein the thermal oxidation is carried out at a temperature of about 600° C.

* * * * *